United States Patent
Abdulla et al.

(10) Patent No.: US 10,530,181 B2
(45) Date of Patent: Jan. 7, 2020

(54) OPTIMAL DISTRIBUTED ENERGY RESOURCE MANAGEMENT SYSTEM

(71) Applicant: International Business Machines Corporation, Armonk, NY (US)

(72) Inventors: Khalid Abdulla, Melbourne (AU); Julia Baldauf, South Melbourne (AU); Julian de Hoog, Melbourne (AU); Benjamin S. Mashford, Melbourne (AU)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/109,958

(22) Filed: Aug. 23, 2018

(65) Prior Publication Data
US 2019/0199123 A1  Jun. 27, 2019

Related U.S. Application Data

(63) Continuation of application No. 15/222,121, filed on Jul. 28, 2016, now Pat. No. 10,148,120.

(51) Int. Cl.
| | |
|---|---|
| *H02J 7/35* | (2006.01) |
| *H02S 40/10* | (2014.01) |
| *H02S 40/42* | (2014.01) |
| *H02S 40/44* | (2014.01) |
| *G05B 15/02* | (2006.01) |
| *H02S 50/10* | (2014.01) |
| *H02J 3/38* | (2006.01) |

(Continued)

(52) U.S. Cl.
CPC .............. *H02J 7/35* (2013.01); *F24F 5/0017* (2013.01); *G05B 15/02* (2013.01); *G05D 23/1917* (2013.01); *H01L 31/024* (2013.01); *H02J 3/383* (2013.01); *H02S 40/10* (2014.12); *H02S 40/42* (2014.12); *H02S 40/44* (2014.12); *H02S 50/00* (2013.01); *F24F 2005/0067* (2013.01); *Y02E 10/563* (2013.01); *Y02E 10/566* (2013.01); *Y02E 10/60* (2013.01)

(58) Field of Classification Search
CPC ............ H01L 31/02021; H01L 31/0521; H02J 3/383; H02J 7/35; H02S 50/10; H02S 40/10; H02S 40/42; H02S 40/44; G05B 15/02
USPC ........................................................ 700/295
See application file for complete search history.

(56) References Cited

U.S. PATENT DOCUMENTS

| | | |
|---|---|---|
| 6,253,563 B1 | 7/2001 | Ewert et al. |
| 6,750,392 B1 | 6/2004 | Yen et al. |

(Continued)

OTHER PUBLICATIONS

List of IBM Patents or Patent Applications Treated as Related, Aug. 2018, 2 pages.

*Primary Examiner* — Michael J Brown
(74) *Attorney, Agent, or Firm* — Harrington & Smith

(57) ABSTRACT

A method comprises generating power at a solar photovoltaic cell; receiving, at a controller, one or more input parameters pertaining to a power output of the solar photovoltaic cell; introducing liquid to the solar photovoltaic cell in response to the power output of the solar photovoltaic cell to increase the efficiency of the solar photovoltaic cell; recovering heat from the liquid introduced to the solar photovoltaic cell; and selecting an appropriate distribution of the power output of the solar photovoltaic cell to one or more power-drawing components in a way that maximizes a chosen objective for the whole of system.

15 Claims, 9 Drawing Sheets

(51) Int. Cl.
*H01L 31/024* (2014.01)
*H02S 50/00* (2014.01)
*F24F 5/00* (2006.01)
*G05D 23/19* (2006.01)

(56) References Cited

U.S. PATENT DOCUMENTS

| | | | |
|---|---|---|---|
| 6,785,592 | B1 | 8/2004 | Smith et al. |
| 10,148,120 | B2 * | 12/2018 | Abdulla .................... H02J 7/35 |
| 2002/0074034 | A1 | 6/2002 | Fujisaki et al. |
| 2007/0144574 | A1 | 6/2007 | Yada |
| 2007/0276547 | A1 | 11/2007 | Miller |
| 2008/0169203 | A1 | 7/2008 | Yekutiely |
| 2011/0282514 | A1 | 11/2011 | Ropp et al. |
| 2012/0206114 | A1 | 8/2012 | Volz |
| 2014/0060620 | A1 | 3/2014 | Placer |
| 2014/0084687 | A1 | 3/2014 | Dent |
| 2017/0194897 | A1 | 7/2017 | Lopez |
| 2017/0272031 | A1 | 9/2017 | Yuque |

\* cited by examiner

OPTIMAL DISTRIBUTED ENERGY RESOURCE MANAGEMENT SYSTEM

CROSS REFERENCE TO RELATED APPLICATION

This patent application is a continuation application of copending U.S. patent application Ser. No. 15/222,121, filed on Jul. 28, 2016, the disclosure of which is incorporated by reference herein in its entirety.

BACKGROUND

The exemplary embodiments of this invention relate generally to energy resource management systems and, more specifically, to the management and control of components in a solar photovoltaic system.

Solar photovoltaic (PV) technology is a fast-growing form of energy generation. Many users have been able to obtain higher returns from solar PV systems via incremental improvements, for example, improvements in solar panel materials or manufacturing processes by which the solar panels are fabricated.

However, solar PV material is only one component in an overall system of generating and using energy. A typical system of generating and using energy based on solar PV technology generally lacks a holistic control system that manages energy generation and consumption in an optimal manner. In particular, systems used to control the generation and use of energy based on solar PV technology generally do not account for environmental factors (such as reduction of solar PV system output due to external temperature or panel soiling), local pricing structures, or additional components that affect energy generation and use (e.g., cooling systems, stationary storage, electric vehicles, and the like).

BRIEF SUMMARY

In one exemplary aspect, a method comprises generating power at a solar photovoltaic cell; receiving, at a controller, one or more input parameters pertaining to a power output of the solar photovoltaic cell; introducing liquid cooling and cleaning to the solar photovoltaic cell in response to the power output of the solar photovoltaic cell to increase the efficiency of the solar photovoltaic cell; recovering heat from the liquid introduced to the solar photovoltaic cell; and selecting an appropriate distribution of the power output of the photovoltaic cell to one or more power-drawing components.

In another exemplary aspect, a system for managing the distribution of energy among multiple components comprises a solar photovoltaic generation system configured to generate power; an energy storage system; a cold storage system; a heat bank; an end user; and a computer that controls operations of the solar photovoltaic generation system, wherein the computer is configured to receive one or more input parameters pertaining to a power output of the solar photovoltaic generation system and one or more input parameters pertaining to power requirements of the energy storage system, the cold storage system, the heat bank, and the end user; wherein the computer is configured to cause the introduction of liquid to the solar photovoltaic generation system in response to the power output of the solar photovoltaic generation system to increase the efficiency of the solar photovoltaic generation system; and wherein the computer is configured to select an appropriate distribution of the power output of the solar photovoltaic cell to one or more of the energy storage system, the cold storage system, the heat bank, and the end user to achieve a user-defined objective.

In another exemplary aspect, a computer program product for managing the distribution of energy among multiple components comprises a computer readable storage medium having program instructions embodied therewith, the program instructions being executable by a computer to cause the computer to: receive one or more input parameters pertaining to a power output of a solar photovoltaic cell; cause liquid to be introduced to the solar photovoltaic cell in response to the power output of the solar photovoltaic cell to increase the efficiency of the solar photovoltaic cell; and select an appropriate distribution of power outputs to one or more power-drawing components.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

Figure 1:
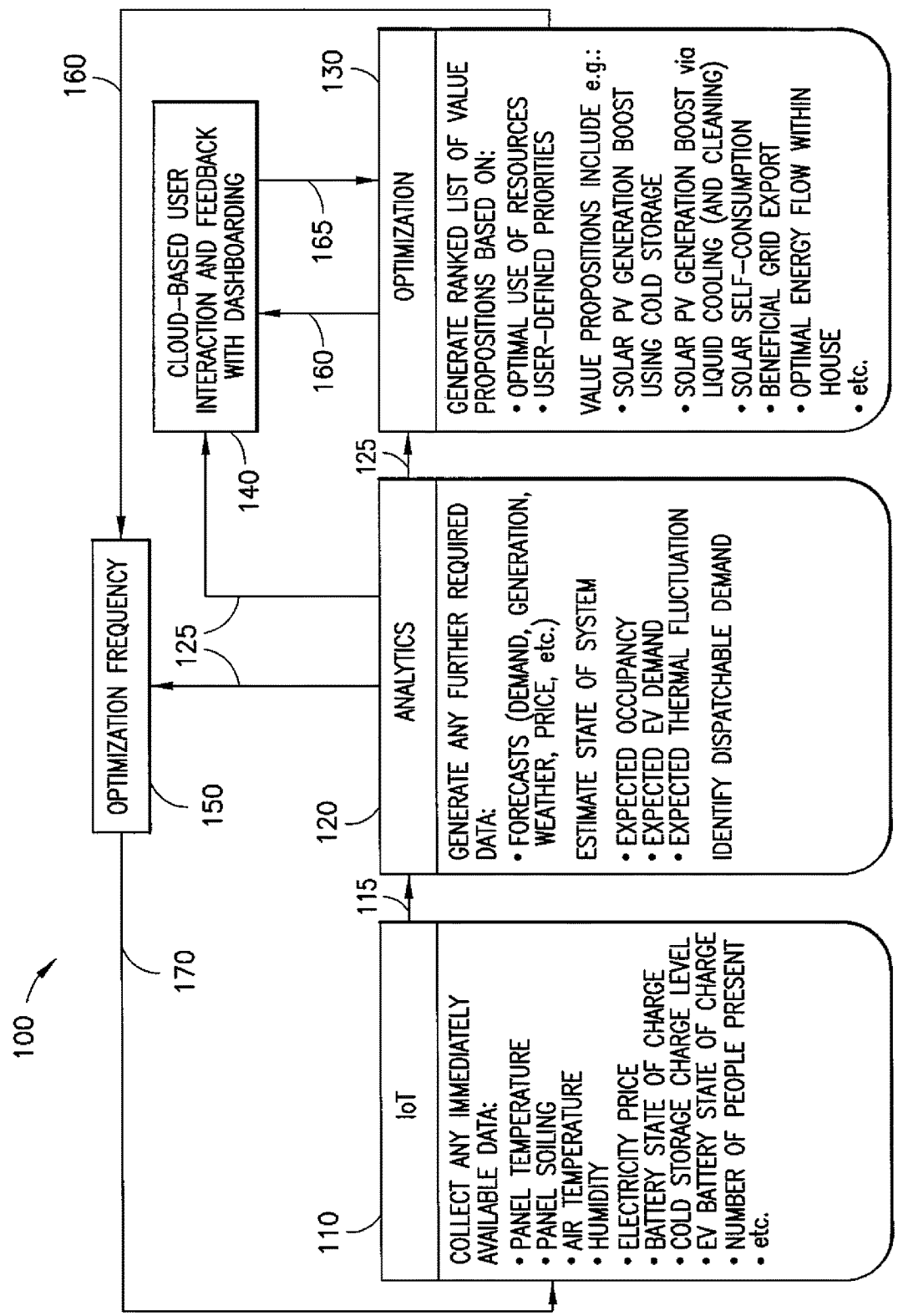
FIG. 1 is a block diagram illustrating one exemplary embodiment of a high level process for optimally distributing energy resources.

Referring to FIG. 1, one exemplary embodiment of a high level process for optimally distributing energy resources is shown generally at 100 and is hereinafter referred to as "process 100." In process 100, an Internet of Things (IoT) 110 may be used to collect data, the data being provided as an output 115 to an analytics module 120, which analyzes the data and provides outputs 125 to one or more of an optimization module 130, a user interaction and feedback module 140, and an optimization frequency module 150. Outputs 160 from the optimization module 130 may also be communicated to the user interaction and feedback module 140 and to the optimization frequency module 150. Feedback 165 may be received from the user interaction and feedback module 140 at the optimization module 130. An output 170 from the optimization frequency module 150 may be returned back to the IoT 110.

The IoT 110 may collect any immediately available data including, but not limited to, temperatures of solar panels, amount of soiling (dirt) on solar panels, air temperature, humidity, electricity price, battery information relating to charge levels, cold storage charge levels, electric vehicle (EV) state of charge, numbers of people present in a building, and the like. As used herein, cold storage charge levels may be temperatures reached by a given amount of cold storage medium (e.g., a refrigerant), an amount of solid ice generated as part of a freezing process, or the like.

The analytics module 120 may, for example, generate further data. Such data includes, but is not limited to, forecast information (e.g., demand, generation, weather, price, and the like). Other data generated by the analytics module 120 may include, but is not limited to, estimated states of sub-systems to which energy resources are optimally distributed (e.g., expected occupancies of buildings, expected EV demands, expected thermal fluctuations, and the like). The analytics module 120 may also identify the amount of dispatchable demand. As used herein, dispatchable demand may be any demand that can be time-shifted. Exemplary dispatchable demands include, but are not limited to, washing machines, dish washers, electric vehicle chargers, and the like, which can be scheduled to charge overnight (when electricity prices are low due to low demand) instead of during the day. In the alternative, such devices may be scheduled to charge in the middle of the day (for example, during peak sunlight hours when solar PV generation is high).

In the optimization module 130, a ranked list of value propositions may be generated. The generated ranked list may be based on optimal use of resources and/or user-defined priorities. Value propositions may include, but are not limited to, solar PV generation boost using cold storage, solar PV generation boost via liquid cooling (and cleaning), solar self-consumption, beneficial grid export, optimal energy flow within a building, and the like.

The user interaction and feedback module 140 may be Cloud-based and may include dashboarding (graphical presentation of a report to a user in real time).

The optimization frequency module 150 may optimize the value propositions from the optimization module 130 based on time. The optimized value propositions may then be returned to the IoT 110. For example, data collected pertinent to the temperatures of the solar panels may be used to determine that the solar panels are operating at an inefficient temperature, which may lead to initiation of a cooling process. Alternatively, a determination that the solar panels are soiled may lead to an initiation of a cleaning process. In some cases both cooling and cleaning may be conducted simultaneously, for example using liquid (e.g., water) sprayed onto or running over the solar panels.

Figure 2A:
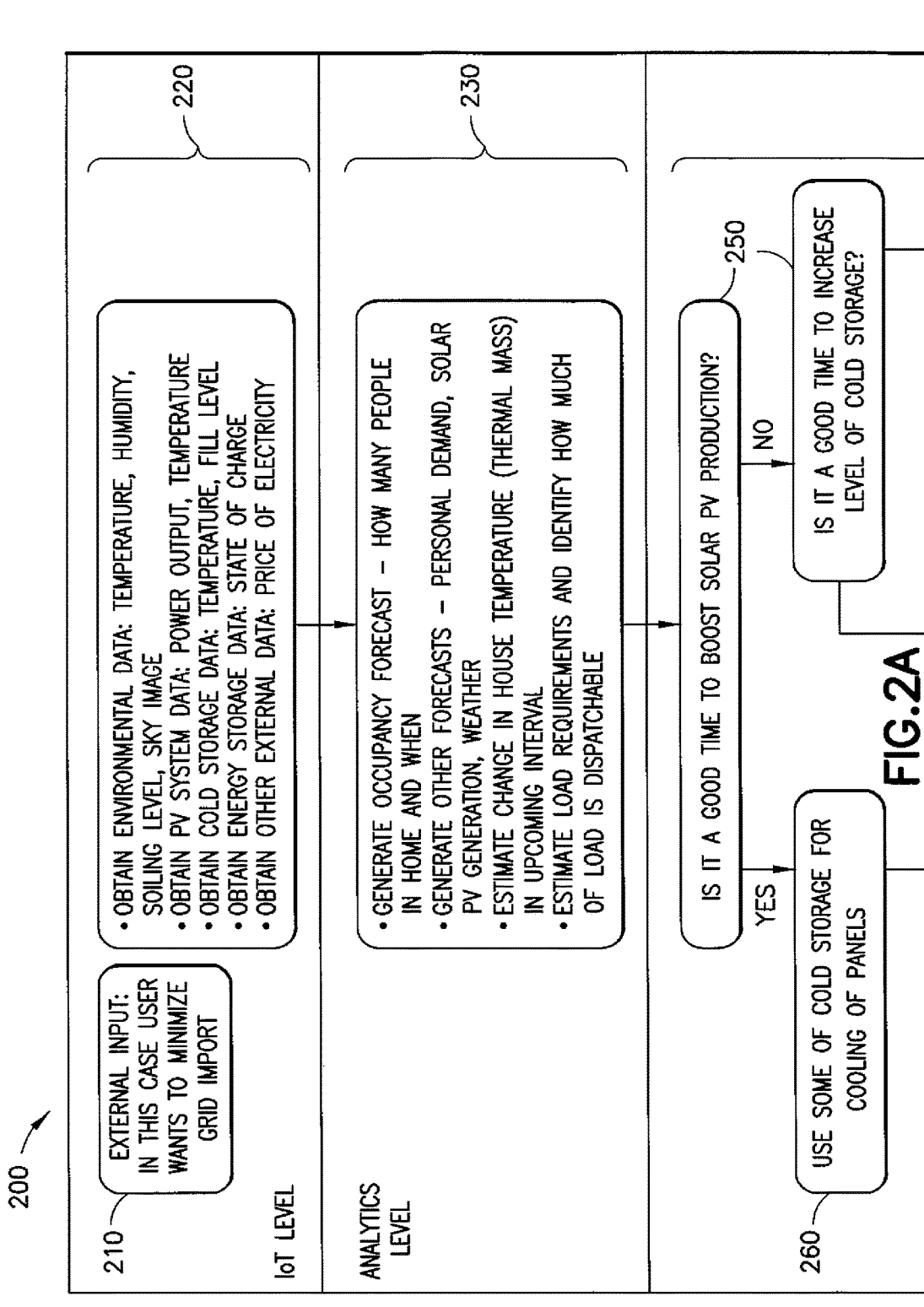
FIGS. 2A and 2B are block diagrams illustrating one exemplary embodiment of an iteration of the optimal distribution of FIG. 1.
Figure 2B:
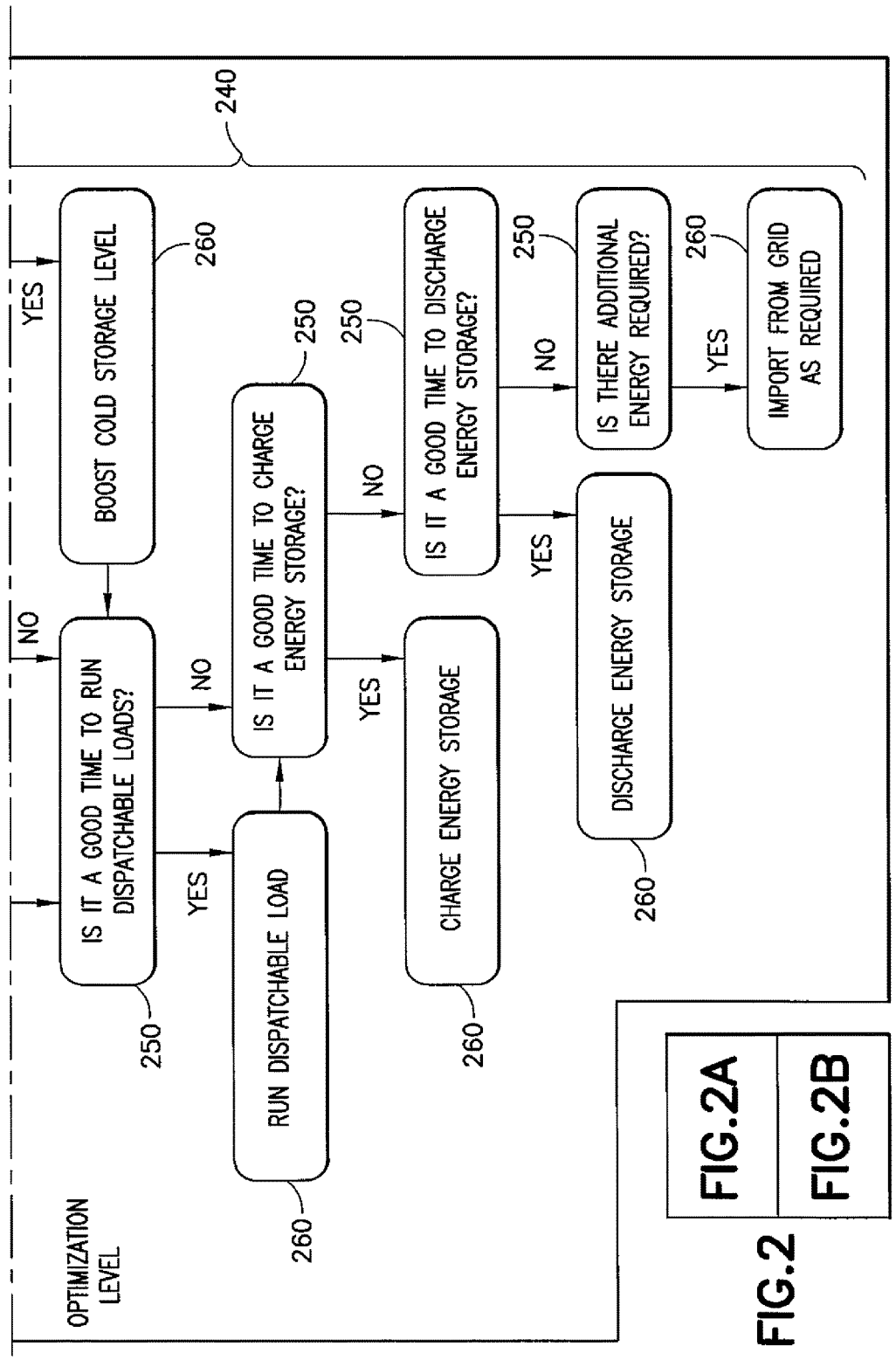

Referring now to FIGS. 2A and 2B, a flow illustrating one iteration of one possible embodiment of the optimal distribution of FIG. 1 from an IoT level 220 through an analytics level 230 and down to an optimization level 240 is shown generally at 200 and is hereinafter referred to as "optimization 200." In optimization 200, a user may desire to minimize support (e.g., input power) from a power grid. External inputs 210 to the IoT level 220 include, but are not limited to, environmental data (e.g., temperature, humidity, soiling levels, sky images, and the like), PV system data (e.g., power output, desired temperatures, and the like), cold storage data (e.g., temperatures, fill levels of refrigerants (for example), and the like), energy storage data (e.g., state of charge), and external data (e.g., price of electricity).

At the analytics level 230, occupancy forecasts may be generated (e.g., numbers of people in a building at specified times). Other forecasts may also be generated (e.g., personal electricity demand, expected solar PV generation, weather, and the like). Furthermore, estimates may be made pertaining to changes in thermal mass as well as load requirements and identifications as to what portions of the total expected load may be dispatchable (and can be shifted if necessary).

At the optimization level 240, various queries 250 are made with subsequent decisions 260 being rendered. For example, queries 250 may pertain to whether solar PV production should be boosted, whether cold storage should be increased, whether dispatchable loads should be run, etc. Decisions 260 rendered may relate to using cold storage for panel cooling, boosting cold storage levels, running dispatchable loads, etc.

Figure 3:
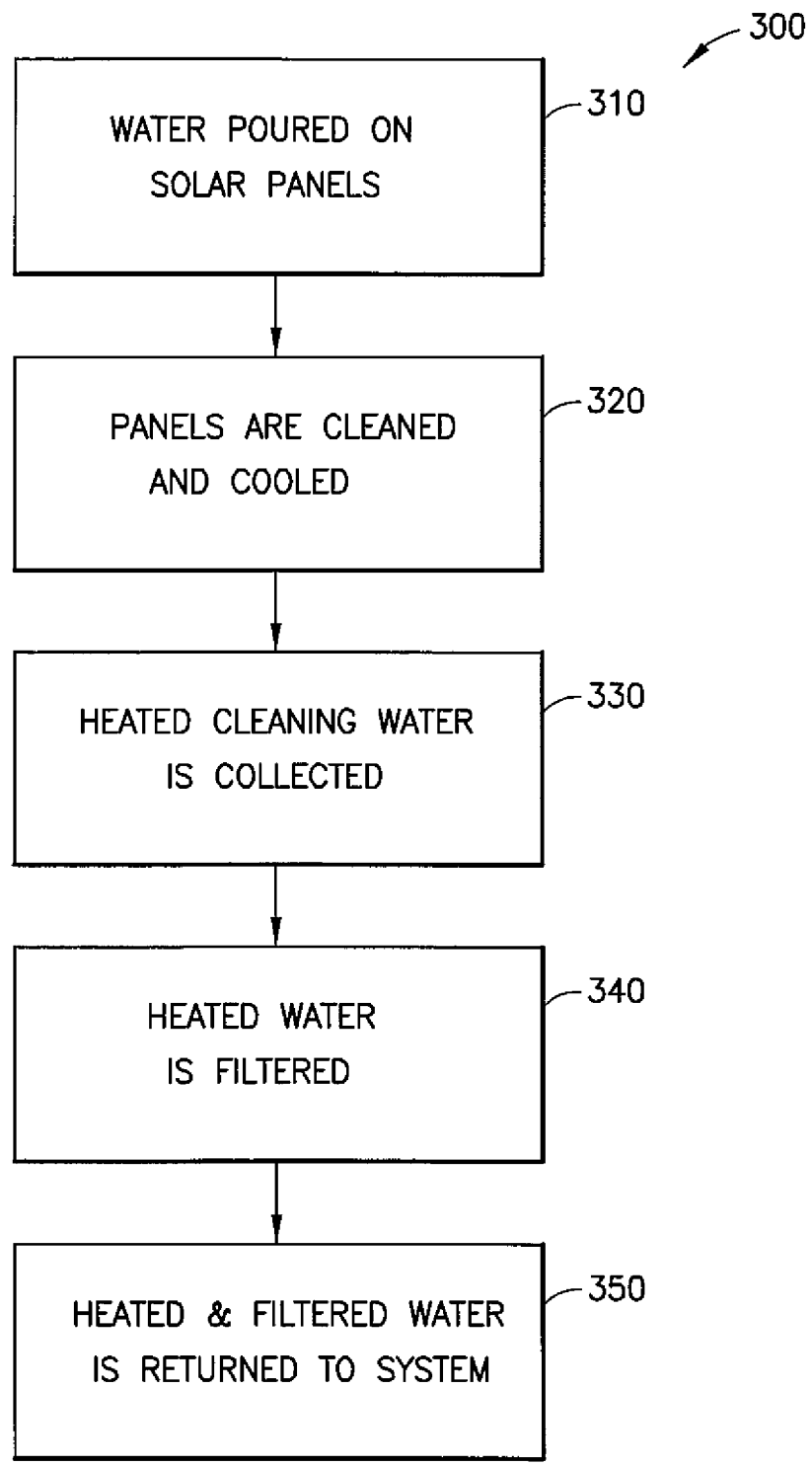
FIG. 3 is a block diagram illustrating another exemplary embodiment of a whole-of-system approach to distributing energy resources in a solar PV system.

Referring to FIG. 3, one exemplary embodiment of a whole-of-system approach to distributing energy resources in a solar PV system associated with a building is shown generally at 300 and is hereinafter referred to as "distribution 300." In the distribution 300, cells of solar panels may be used to generate power for any desired building use. Water may be introduced to the solar panels as indicated in block 310. The water may be poured, sprayed, misted, trickled, or otherwise introduced to the solar panels. The water may be clean water (e.g., building tap water). As an alternative or in addition to clean water, water from another source such as collected rainwater or graywater may be used. As shown in block 320, the cells of the solar panels may be cleaned and cooled by the water, thus increasing the efficiency of the cells. The water, which recovers heat from the solar panels, may be collected as indicated in block 330. The heated water may be filtered if needed as indicated in block 340. The heated water may then be reused, for example, in a hot water system, in a heat bank, or for any other building purpose as indicated in block 350.

Figure 4:
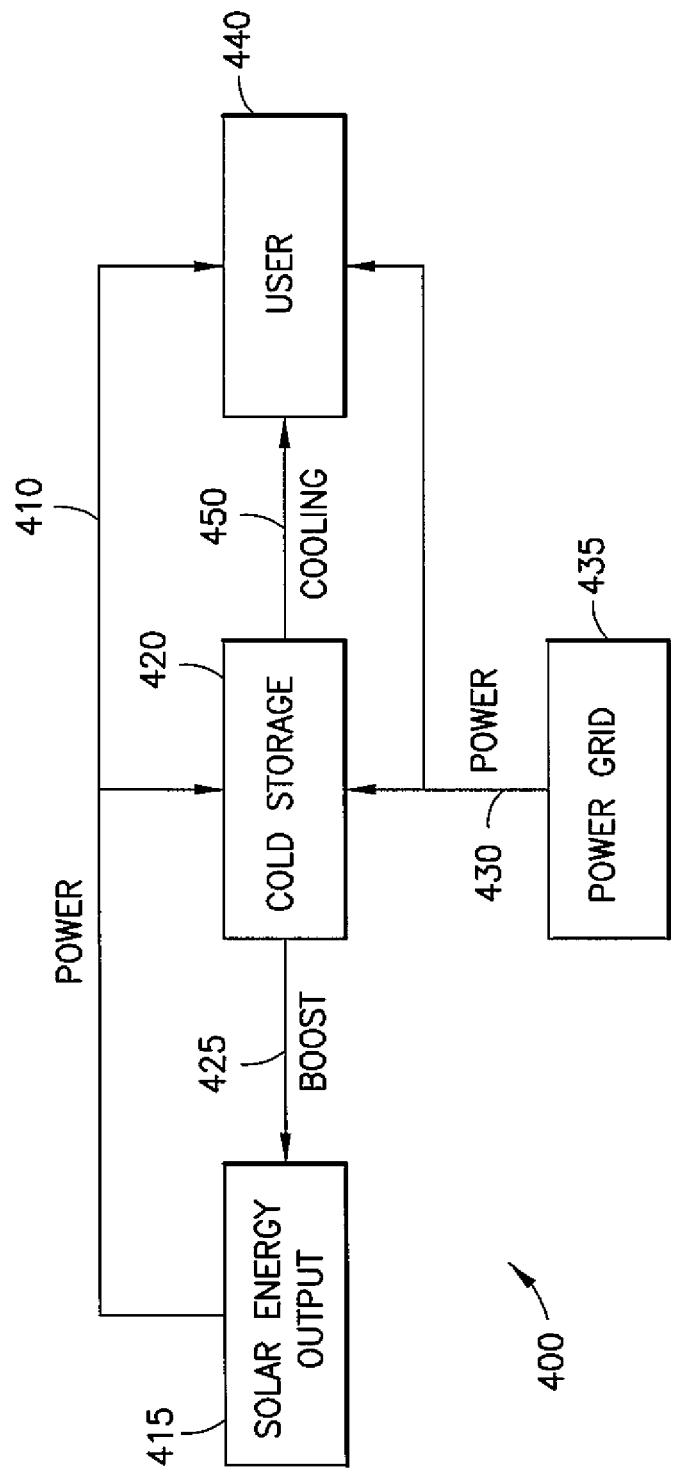
FIG. 4 is a block diagram illustrating another exemplary embodiment of a whole-of-system approach to distributing energy resources in a solar PV system.

Referring to FIG. 4, another exemplary embodiment of a whole-of-system approach to distributing energy resources in a solar PV system associated with a building is shown generally at 400 and is hereinafter referred to as "distribution 400." In the distribution 400, power output 410 from a panel 415 of a solar PV system can be used to provide cooling (e.g., for refrigeration or air conditioning) to a cold storage 420. Operation of the solar PV system can also be boosted 425 by the cold storage 420 (e.g., cooling can be returned to the cells of the panel 415 to boost efficiency at times when increased solar PV generation is desired). The cold storage 420 can also be cooled using a power output 430 of a power grid 435. A building 440 (e.g., house, commercial building, factory, or the like) may be powered by one or both of the power output 410 from the panel 415 and the power output 430 from the power grid 435. The building may also be cooled by a cooling stream 450 from the cold storage 420. In doing so, cost savings may be realized by the use of the power output 410 from the panels 415 to cool the cold storage 420 with the use of excess power from the cold storage 420. This dual use both cools the building 440 and boosts PV generation at the panel 415 (e.g., by about 10%) when needed most. Thus, there is no low-value export of energy back to the power grid 435, and there is both a reduction in demand from the power grid 435 and an increase in power generation at times of peak power draw.

Figure 5:
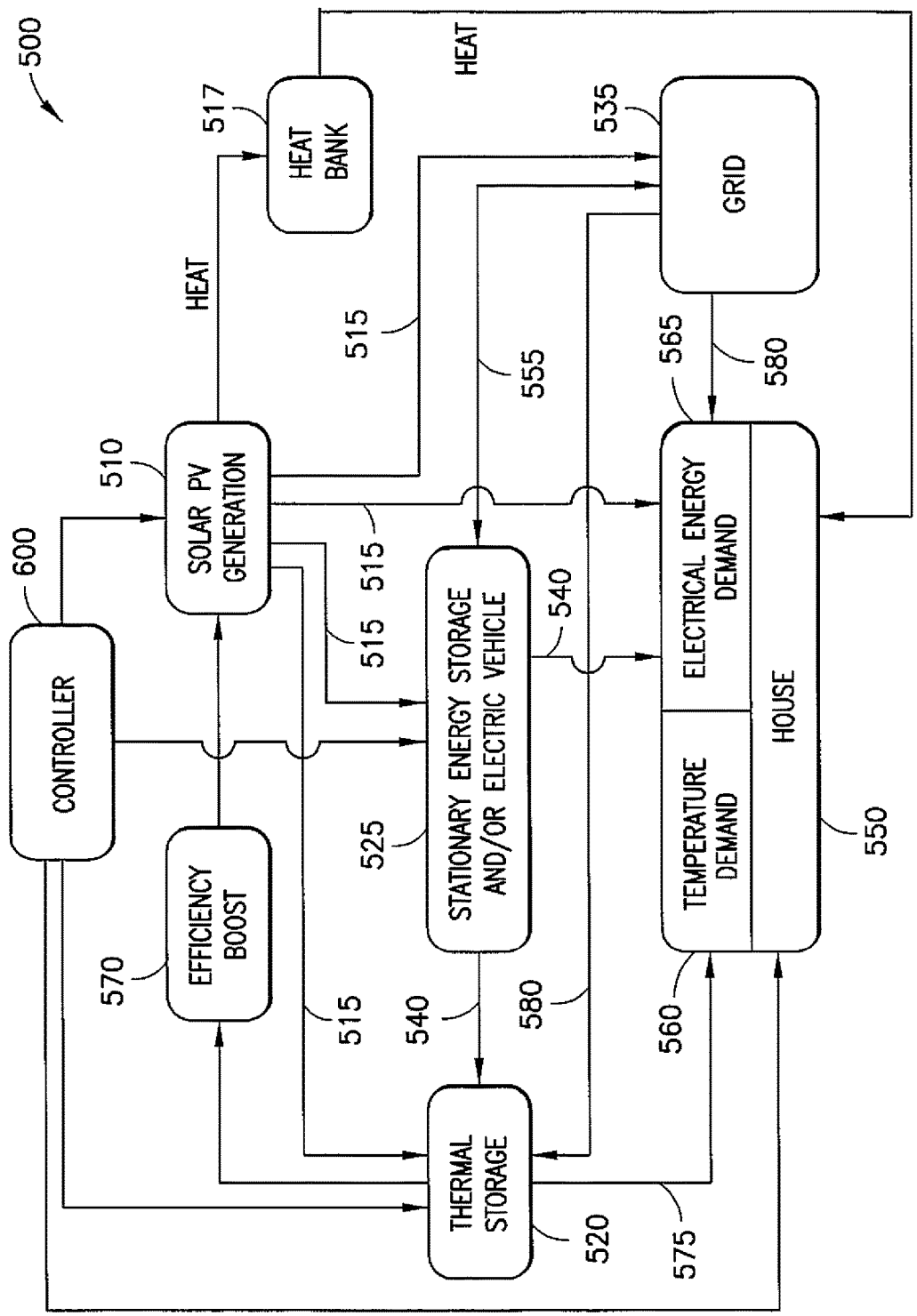
FIG. 5 is a block diagram illustrating one exemplary approach to the optimal management and control of the generation of power, energy storage components, and cold storage components.

Referring now to FIG. 5, a holistic approach to optimal management and control of the generation of power, energy storage components, and thermal storage components using a controller is shown generally at 500 and is referred to as "system 500." System 500 may use the controller (shown at 600) to control operation of a solar PV generation apparatus 510 and further to operate power-drawing components of the system 500 in an optimal manner according to a desired operation mode.

System 500 is a user-defined environment that comprises the solar PV generation apparatus 510 (e.g., comprising panels 415) configured to provide power output 515 to one or more power-drawing components or sub-systems such as, for example, a system for cold storage 520, a system for energy storage 525, and a building 550. As indicated herein, the solar PV generation apparatus 510 may, based on data collected pertaining to power output of the solar PV generation apparatus 510, introduce liquid to the solar PV generation apparatus 510 to cool and/or clean the cells of the panels, thereby increasing the efficiency of the solar PV generation apparatus 510. Furthermore, any heat recovered from the cooling and/or cleaning may be either applied to one or more components of the system (e.g., as heat to the building 550) or stored in a heat bank 517 for subsequent use in one or more components of the system.

The cold storage 520 may comprise a refrigeration or air conditioning system driven by the power output 515 from the solar PV generation apparatus 510. Furthermore, the energy storage 525 may comprise any suitable energy storage apparatus, e.g., a battery bank, an electric vehicle, or the like, to which the power output 515 from the solar PV generation apparatus 510 provides power. The energy storage 525 may be configured to provide outputs 540 to the cold storage 520 and the building 550. The energy storage 525 may be further configured to exchange power 555 with a power grid 535. The power grid 535 may provide an output 580 to the cold storage 520 and/or to the building 550, which may have a temperature demand 560 and an electrical energy demand 565. The cold storage 520 may be configured to provide an output as an efficiency boost 570 back to the solar PV generation apparatus 510 by cooling the solar PV generation apparatus 510 and also to provide an output 575 as cooling to the building 550. The controller 600 may be configured to control various aspects of the cold storage 520, the energy storage 525, the building 550, and the solar PV generation apparatus 510 to manage the optimal distribution of energy resources.

Figure 6:
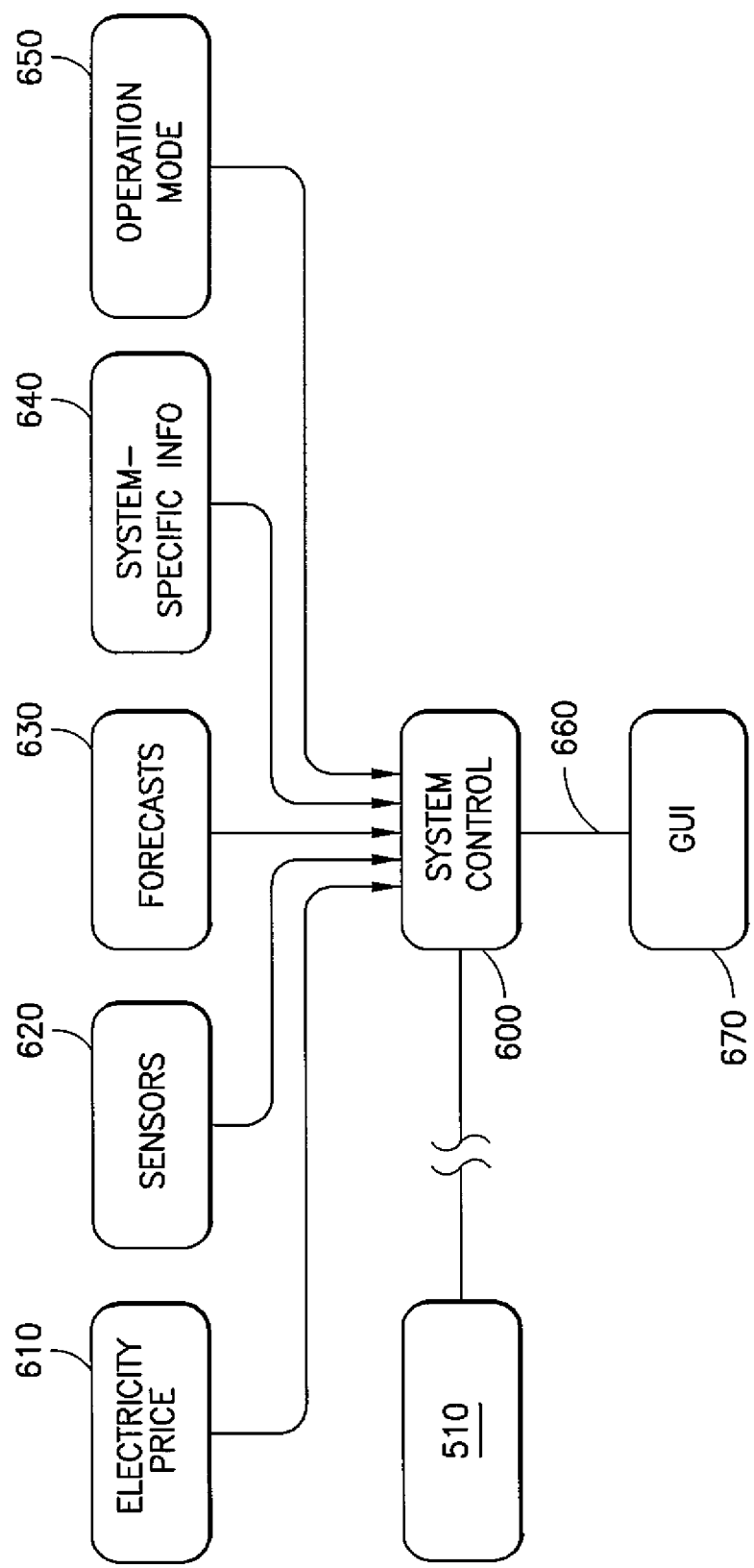
FIG. 6 is a block diagram of a controller for use with the approach of FIG. 5.

Referring now to FIG. 6, the controller 600 is configured to distribute the power generated by the solar PV apparatus 510 as well as the cooling and/or cleaning of the panels of the solar PV apparatus 510 and any further use of the resulting (possibly heated) liquid. The controller 600 is also configured to receive a plurality of input parameters including, but not limited to, electricity price 610, information from sensors 620, forecasts 630, system-specific information 640, operation mode constraints 650, and any other available information. Such inputs may be used by the controller 600, in conjunction with the controlled generated power from the solar PV apparatus 510, to make optimal system decisions at discrete intervals. In doing so, the controller 600 selects appropriate distributions of the available outputs to the power-drawing components such as the cold storage 520, the energy storage 525, and the power grid 535. The optimal system decisions and the appropriately selected distributions of output 660 may be displayed on a graphical user interface (GUI 670).

With regard to the inputs to the controller 600 (which may be a "smart" controller), an algorithm that seeks to optimize the user-defined environment may be employed. Thus, the controller 600 is more than a simple thermostat since it integrates several datasets based on the input parameters (the forecasts 630 such as weather forecasts, the system-specific information, and the like).

The sensors 620 may receive information such as temperature inside the building 550 (which may be multiple temperatures taken at various points), temperature of the cell surface of the panels 415 of the solar PV apparatus 510, temperature of the cold storage 520, and the like. For sensed temperatures inside the building that are above a specified setpoint, the controller 600 may direct the cold storage 520 to provide additional cooling to the building 550. For sensed temperatures inside the building that are below a specified setpoint, the controller 600 may direct the building 550 (e.g., via the temperature demand 560) to draw heat from the heat bank 517. The sensors 620 may also receive information such as external air temperatures, battery storage levels, indications of power produced by the solar PV apparatus 510, the number of people in the building 550 at different times, and the like. An indication of the power produced by the solar PV apparatus 510 may be used to estimate the extent of soiling of the panels 415 (e.g., how much dirt has accumulated), thus causing the appropriate liquid to be directed to the solar PV apparatus 510 for cleaning.

The forecasts 630 received into the controller 600 may include information relating to the amount of predicted sun (or cloud cover), predicted temperature/weather, and predicted energy usage. With regard to predicted energy usage, a dataset may be compiled over time, such a dataset being indicative of past usage patterns and containing all the relevant measurements for predicting future energy consumption patterns. Machine-learning methods may enable the accuracy of such predictions to continually improve over time.

System-specific information 640 that may be input into the controller 600 includes, for example, tariff structure and battery degradation rates as well as configuration parameters for each of the system components. Such configuration parameters may be related to the cells of the panels 415 of the solar PV apparatus 510, inverters, batteries, and the cold storage 520 (e.g., air conditioning, refrigeration, other building cooling mechanisms). For each system component, various relevant parameters may be stored in a memory. For example, a battery system may need to specify battery capacity, charge/discharge rates, preferred charge levels, efficiencies at various levels, degradation of the batteries, and the like.

Figure 7:
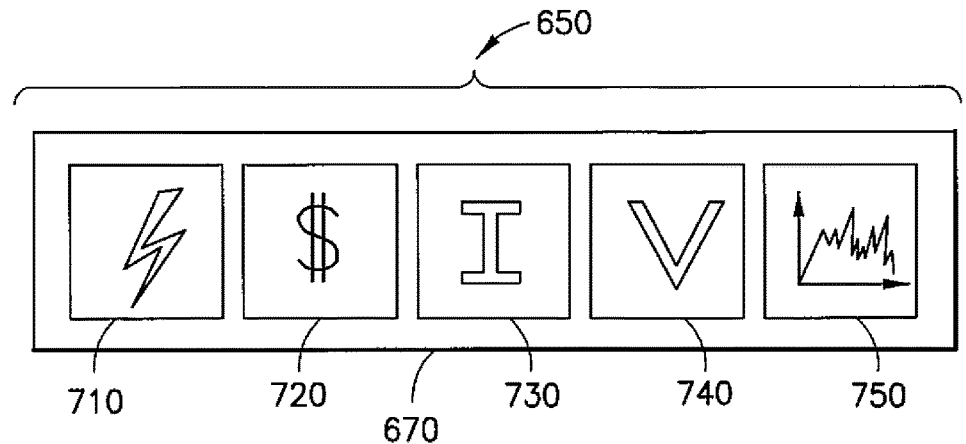
FIG. 7 is a schematic illustration of operation mode constraints of the controller of FIG. 6.

Referring now to FIG. 7, exemplary embodiments of the operation mode constraints 650 are shown. Each operation mode constraint 650 may be selectable via touch controls on the GUI 670. Various operation mode constraints 650 include those configured to: take advantage of energy output based on frequency of power outages (e.g., selecting mode 710 may configure the system to always have a battery charged to 60%); take advantage of cost savings (e.g., selecting mode 720 may configure the system to save as much money on energy as possible, possibly by drawing and storing grid power during off-peak times); promote grid independence (e.g., selecting mode 730 to use as little grid power as possible); set a vacation mode 740 (e.g., to sell as much power as possible back to the power grid 535); and set a commercial or industrial mode 750 (e.g., to avoid surpassing a peak demand level at all times).

At different times, a user may desire different operating modes. A simplified GUI 670 may allow the user to define their overall goals, with the underlying details of the configurations of the mode constraints 650 being generally hidden. A Cloud-based GUI may also allow the user to control and monitor their particular system remotely.

Figure 8:
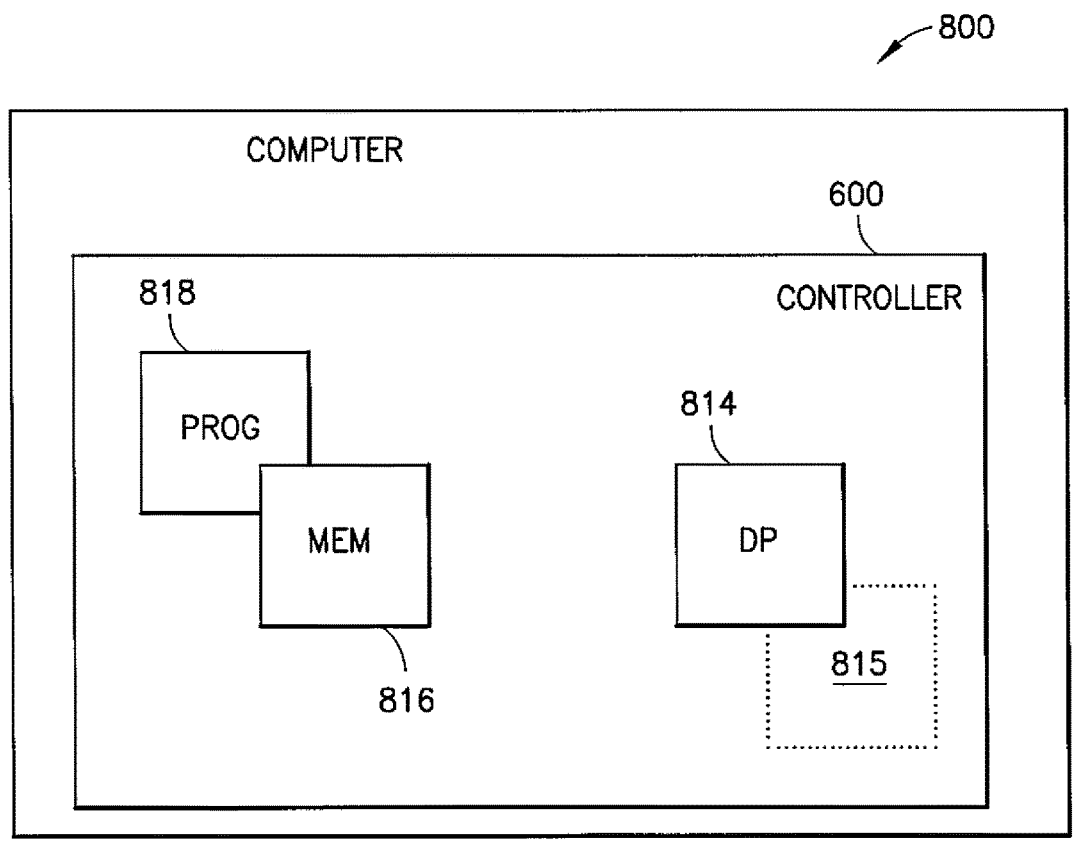
FIG. 8 is a block diagram of one exemplary embodiment of electronic devices that are suitable for use in the embodiments described herein.

Referring now to FIG. 8, a simplified block diagram of various electronic devices and apparatuses that are suitable for use in practicing the exemplary embodiments described herein is shown. For example, a computer 800 may be used to control one or more of the processes as described above. The computer 800 includes a controller (e.g., controller 600) which has a data processor (DP) 814 and a computer-readable memory medium embodied as a memory (MEM) 816 that stores a program of computer instructions (PROG) 818.

The PROG 818 includes program instructions that, when executed by the associated DP 814, enable the various electronic devices and apparatuses to operate in accordance with exemplary embodiments. That is, various exemplary embodiments may be implemented at least in part by computer software executable by the DP 814 of the computer 800, or by hardware, or by a combination of software and hardware (and firmware).

The computer 800 may also include dedicated processors, for example a processor 815 that manipulates data pertaining to the input parameters to initiate cooling and/or cleaning at the solar PV apparatus 510 and to distribute power in an optimal manner.

The computer readable MEM 816 may be of any type suitable to the local technical environment and may be implemented using any suitable data storage technology, such as semiconductor based memory devices, flash memory, magnetic memory devices and systems, optical memory devices and systems, fixed memory, and removable memory. The DP 814 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the methods described herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network, and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In one exemplary embodiment, a method comprises generating power at a solar photovoltaic cell; receiving, at a controller, one or more input parameters pertaining to a power output of the solar photovoltaic cell; introducing liquid cooling and cleaning to the solar photovoltaic cell in response to the power output of the solar photovoltaic cell to increase the efficiency of the solar photovoltaic cell; recovering heat from the liquid introduced to the solar photovoltaic cell; and selecting an appropriate distribution of the power output of the photovoltaic cell to one or more power-drawing components.

The method may further comprise storing the recovered heat from the liquid introduced to the solar photovoltaic cell. The method may further comprise causing the solar photovoltaic cell to exchange power with a power grid. The method may further comprise estimating an amount of soiling on the solar photovoltaic cell in response to receiving one or more input parameters pertaining to a power output of the solar photovoltaic cell. Receiving one or more input parameters pertaining to a power output of the solar photovoltaic cell may comprise receiving one or more of information from a sensor, information from a forecast, information specific to the solar photovoltaic cell, and information from an operation mode constraint. Introducing liquid to the solar photovoltaic cell may comprise one or more of pouring, spraying, misting, and trickling liquid on the solar photovoltaic cell. The method may further comprise filtering the liquid after recovery of the heat from the liquid. Selecting an appropriate distribution of the output of the solar photovoltaic cell to one or more power-drawing components may comprise distributing outputs to one or more of a cold storage system, an energy storage system, and a building. One of the system components may be a stationary or mobile energy storage system that can be charged by one or both of the solar photovoltaic cell and the power grid, and discharge to one or more of a building, the power grid, and a cold storage system. One of the system components may be a cold storage system that may receive energy from one or more of the solar photovoltaic cell, the power grid, and the energy storage system, and provide cooling to one or both of the solar photovoltaic system and a building.

In another exemplary embodiment, a system for managing the distribution of energy among multiple components comprises a solar photovoltaic generation system configured to generate power; an energy storage system; a cold storage system; a heat bank; an end user; and a computer that controls operations of the solar photovoltaic generation system, wherein the computer is configured to receive one or more input parameters pertaining to a power output of the solar photovoltaic generation system and one or more input parameters pertaining to power requirements of the energy storage system, the cold storage system, the heat bank, and the end user; wherein the computer is configured to cause the introduction of liquid to the solar photovoltaic generation system in response to the power output of the solar photovoltaic generation system to increase the efficiency of the solar photovoltaic generation system; and wherein the computer is configured to select an appropriate distribution of the power output of the solar photovoltaic cell to one or more of the energy storage system, the cold storage system, the heat bank, and the end user to achieve a user-defined objective.

In the system, the computer may be further configured to cause the solar photovoltaic generation system to exchange power with a power grid. The computer may be further configured to estimate an amount of soiling on a solar photovoltaic cell of the solar photovoltaic generation system in response to receiving one or more input parameters pertaining to a power output of the solar photovoltaic generation system. The computer configured to receive one or more input parameters pertaining to a power output of the solar photovoltaic generation system may comprise receiving one or more of information from a sensor, information from a forecast, information specific to the solar photovoltaic cell, and information from an operation mode constraint. The computer configured to cause the introduction of liquid to the solar photovoltaic cell may comprise one or more of pouring, spraying, misting, and trickling liquid on the solar photovoltaic cell. The computer configured to select an appropriate distribution of the power output of the solar photovoltaic generation system to one or more power-drawing components may comprise distributing outputs to one or more of a cold storage system, an energy storage system, and a building.

In another exemplary embodiment, a computer program product for managing the distribution of energy among multiple components comprises a computer readable storage medium having program instructions embodied therewith, the program instructions being executable by a computer to cause the computer to: receive one or more input parameters pertaining to a power output of a solar photovoltaic cell; cause liquid to be introduced to the solar photovoltaic cell in response to the power output of the solar photovoltaic cell to increase the efficiency of the solar photovoltaic cell; and select an appropriate distribution of power outputs to one or more power-drawing components.

The computer program product may further comprise causing the computer to initiate an exchange of power between the solar photovoltaic cell and a power grid. The computer program product may further comprise causing the computer to estimate an amount of soiling on the solar photovoltaic cell in response to receiving one or more input parameters pertaining to a power output of the solar photovoltaic cell. Causing the computer to select an appropriate distribution of power outputs to one or more power-drawing components may comprise causing the computer to distribute outputs to one or more of a cold storage system, an energy storage system, and a building.

Example 1

Referring back to FIG. 3, in one example of the incorporation of the distribution 300 into a building at a particular location, an increased value was realized by the cooling aspect of the water. In particular, on a hot day, up to about a 20% increase in the generation of heat was realized. Additionally, on a warm day, about an 11% increase in the generation of heat was realized. Furthermore, over an average 145 day summer drought, soiling resulted in a 7.4% loss in efficiency. The loss in efficiency due to soiling was determined to be more than an order of magnitude larger than losses due to degradation of cells in solar panels in the solar PV system installed. Variations were noted in other locations. Moreover, with regard to the cost of water and filtration, rainwater was collected at no cost, and tap water was used at a small cost (and no pumping cost). The filtration of rainwater, even after cleaning of the solar panels, was commonplace and not expensive.

Example 2

Figure 9:
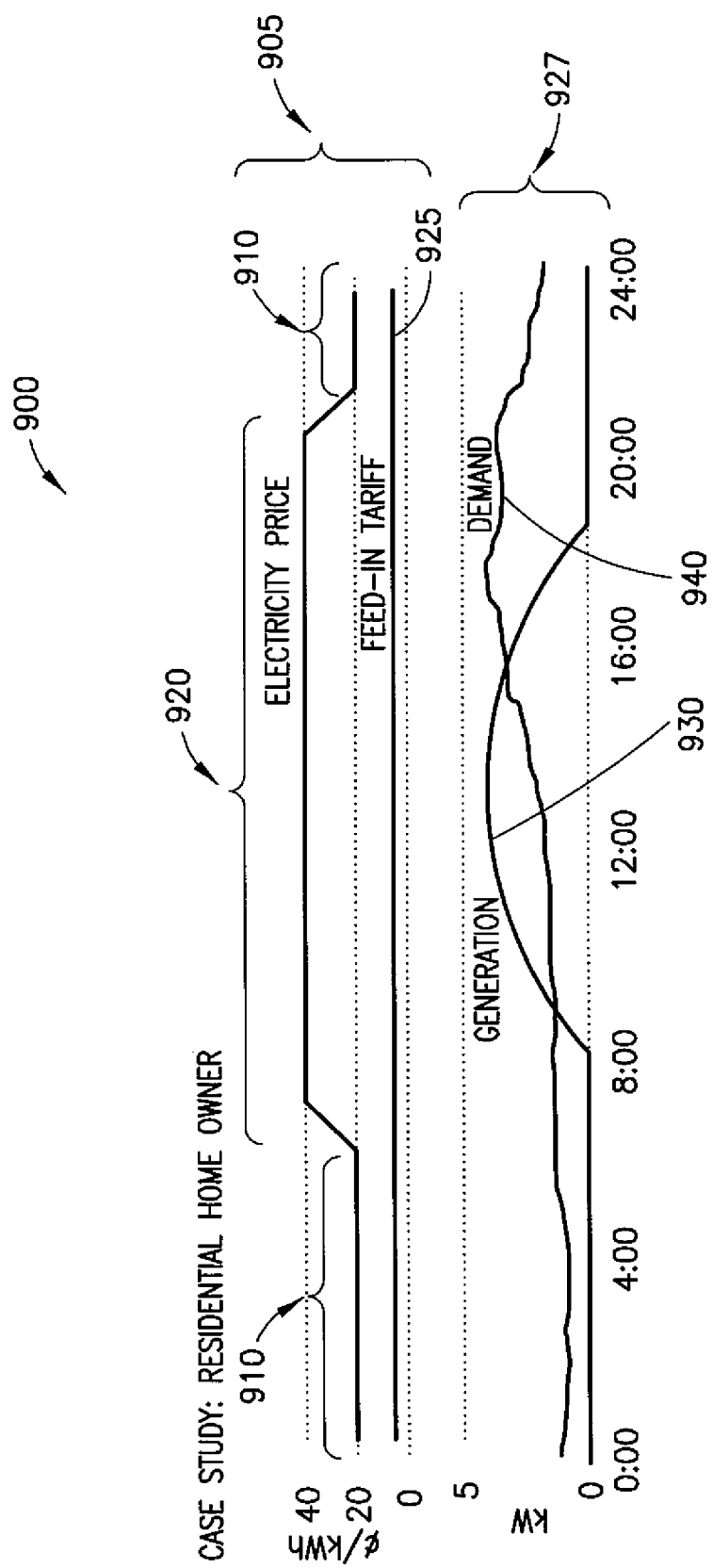
FIG. 9 is a graphical representation of electricity price and usage over the course of a day.

Referring now to FIG. 9, in one example of a case study involving an idealized power demand profile averaged over a plurality of users, electricity price and usage over the course of a typical day is shown generally by graph 900. As can be seen by the graph 900, electricity price per kilowatt hour (kWh) (shown at 905) from a power grid was about $0.20 through the early morning hours (off-peak time 910 during which draw from the power grid was minimal), after which the price doubled and remained constant until about mid-evening hours (peak usage time 920 during which draw from the power grid was heavy). After the peak usage time 920, the price per kWh returned to about $0.20.

Over part of this cycle, electricity was produced by system 500. The electricity produced could be fed back to the power grid at a feed-in tariff 925 of $0.05 per kWh. However, given that import of energy was at least $0.20/kWh (during off-peak hours) and $0.40/kWh (during peak hours), feeding back to the grid represented a loss of value at all times.

Looking at power generation and demand profiles 927 over time, since generation 930 by the system 500 occurred during daylight hours but a peak demand 940 was somewhat later, a differential was observed between export and import tariffs (export exceeded import from about 9:00 AM to about 4:00 PM, after which draw from the power grid was greater than generation by the system 500). Thus, every kWh of solar PV power that was not self-consumed occurred between about 9:00 AM to about 4:00 PM. If this excess generation could have been stored locally to offset later (peak) energy use, each kWh shifted would save $0.40/kWh while representing a lost feed-in tariff opportunity of $0.05/kWh, for a net value gain of $0.35 per kWh.

At the same time, with lower costs for energy overnight ($0.20) and higher costs during the day ($0.40) there was another price differential (of $0.20) that could be taken advantage of in terms of tariff optimization—charging an energy storage system overnight and discharging during the day.

An energy storage system in this embodiment therefore would need to trade off two possible value streams against one another, with maximization of solar self-consumption (at $0.35/kWh) as the most attractive option, but tariff optimization ($0.20/kWh) as an additional important value stream.

In some instances, excessive generation may lead to high voltages in the power grid, which may in turn lead to curtailment of electricity being generated by solar PV systems. Therefore, it may be desirable to shift the peak demand 940 as much as possible to the time period of optimal generation 930, or to store excess generation during optimal generation 930.

The foregoing description has provided by way of exemplary and non-limiting examples a full and informative description of the best methods, systems, and apparatuses presently contemplated by the inventors for carrying out various exemplary embodiments. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments.

Furthermore, some of the features of the preferred embodiments could be used to advantage without the corresponding use of other features. As such, the foregoing description should be considered as merely illustrative of the principles, and not in limitation thereof.

What is claimed is:

1. A system for managing the distribution of energy among multiple components, the system comprising:
   a solar photovoltaic generation system configured to generate power;
   an energy storage system;
   a cold storage system;
   a heat bank;
   an end user; and
   a computer that controls operations of the solar photovoltaic generation system;
   wherein the computer is configured to receive one or more input parameters pertaining to a power output of the solar photovoltaic generation system and one or more input parameters pertaining to power requirements of the energy storage system, the cold storage system, the heat bank, and the end user;
   wherein the computer is configured to cause the introduction of liquid to the solar photovoltaic generation system in response to the power output of the solar photovoltaic generation system to increase the efficiency of the solar photovoltaic generation system;
   wherein the computer is configured to predict, using one or more of the input parameters, an energy consumption pattern;
   wherein the computer configured to predict, using one or more of the input parameters, an energy consumption pattern comprises compiling a dataset of at least one past distribution of the power output of the solar photovoltaic cell to one or more of the energy storage system, the cold storage system, the heat bank, and the end user;

wherein the computer is configured to select an appropriate distribution of the power output of the solar photovoltaic cell to one or more of the energy storage system, the cold storage system, the heat bank, and the end user, based on the predicted energy consumption pattern, to achieve a user-defined objective; and wherein the computer is configured to use machine-learning to improve an accuracy of the predicted energy consumption pattern.

2. The system of claim 1, wherein the computer is further configured to cause the solar photovoltaic generation system to exchange power with a power grid.

3. The system of claim 1, wherein the computer is further configured to estimate an amount of soiling on a solar photovoltaic cell of the solar photovoltaic generation system in response to receiving one or more input parameters pertaining to a power output of the solar photovoltaic generation system.

4. The system of claim 1, wherein the computer configured to receive one or more input parameters pertaining to a power output of the solar photovoltaic generation system comprises receiving one or more of information from a sensor, information from a forecast, information specific to the solar photovoltaic cell, and information from an operation mode constraint.

5. The system of claim 1, wherein the computer configured to cause the introduction of liquid to the solar photovoltaic cell comprises one or more of pouring, spraying, misting, and trickling liquid on the solar photovoltaic cell.

6. The system of claim 1, wherein the computer configured to select an appropriate distribution of the power output of the solar photovoltaic generation system to one or more power-drawing components comprises distributing outputs to one or more of a cold storage system, an energy storage system, and a building.

7. A method, comprising:
generating power at a solar photovoltaic cell;
receiving, at a controller, one or more input parameters pertaining to a power output of the solar photovoltaic cell;
introducing, from a cold storage system, liquid cooling and cleaning to the solar photovoltaic cell in response to the power output of the solar photovoltaic cell to increase the efficiency of the solar photovoltaic cell;
recovering heat from the liquid introduced to the solar photovoltaic cell;
compiling a dataset of the one or more input parameters and amounts of recovered heat from the liquid introduced to the solar photovoltaic cell;
predicting, from the compiled dataset of the one or more input parameters and the amounts of heat recovered, an energy consumption pattern; and
selecting an appropriate distribution of the power output of the photovoltaic cell to one or more power-drawing components;
wherein selecting an appropriate distribution of the power output of the solar photovoltaic cell to one or more power-drawing components comprises distributing outputs to one or more of the cold storage system, an energy storage system, and a building based on the predicted energy consumption pattern; and
wherein predicting an energy consumption pattern comprises using machine-learning to improve an accuracy of the predicted energy consumption pattern.

8. The method of claim 7, further comprising storing the recovered heat from the liquid introduced to the solar photovoltaic cell.

9. The method of claim 7, further comprising causing the solar photovoltaic cell to exchange power with a power grid.

10. The method of claim 7, further comprising estimating an amount of soiling on the solar photovoltaic cell in response to receiving one or more input parameters pertaining to a power output of the solar photovoltaic cell.

11. The method of claim 7, wherein receiving one or more input parameters pertaining to a power output of the solar photovoltaic cell comprises receiving one or more of information from a sensor, information from a forecast, information specific to the solar photovoltaic cell, and information from an operation mode constraint.

12. The method of claim 7, wherein introducing liquid to the solar photovoltaic cell comprises one or more of pouring, spraying, misting, and trickling liquid on the solar photovoltaic cell.

13. The method of claim 7, further comprising filtering the liquid after recovery of the heat from the liquid.

14. The method of claim 7, wherein one of the system components is a stationary or mobile energy storage system that can be charged by one or both of the solar photovoltaic cell and the power grid, and discharge to one or more of a building, the power grid, and the cold storage system.

15. The method of claim 7, wherein one of the system components is the cold storage system that may receive energy from one or more of the solar photovoltaic cell, the power grid, and the energy storage system, and provide cooling to one or both of the solar photovoltaic system and a building.

* * * * *